(12) United States Patent
Wada et al.

(10) Patent No.: US 7,884,553 B2
(45) Date of Patent: Feb. 8, 2011

(54) LIGHT-EMITTING DIODE ILLUMINATION CIRCUIT, ILLUMINATION DEVICE, AND LIQUID CRYSTAL DISPLAY APPARATUS

(75) Inventors: Haruaki Wada, Chiba (JP); Kunio Oshimo, Kanagawa (JP); Takenobu Urazono, Kanagawa (JP)

(73) Assignee: Sony Corporation, Tokyo (JP)

( * ) Notice: Subject to any disclaimer, the term of this patent is extended or adjusted under 35 U.S.C. 154(b) by 937 days.

(21) Appl. No.: 11/749,456

(22) Filed: May 16, 2007

(65) Prior Publication Data

US 2008/0106205 A1 May 8, 2008

(30) Foreign Application Priority Data

Jul. 6, 2006 (JP) ............................. 2006-158870

(51) Int. Cl.
*H05B 37/00* (2006.01)
(52) U.S. Cl. .................................. 315/185 R
(58) Field of Classification Search ............. 315/312, 315/185 R, 185 S
See application file for complete search history.

(56) References Cited

U.S. PATENT DOCUMENTS

| 6,518,707 | B2 * | 2/2003 | Gershen et al. | ............. 315/129 |
| 6,608,332 | B2 * | 8/2003 | Shimizu et al. | ............. 257/98 |
| 7,071,616 | B2 * | 7/2006 | Shimizu et al. | ............. 313/506 |
| 7,262,752 | B2 * | 8/2007 | Weindorf | ............. 345/82 |
| 2008/0007885 | A1 * | 1/2008 | Mehrl et al. | ............. 361/104 |

FOREIGN PATENT DOCUMENTS

JP 2002-335012 11/2002

\* cited by examiner

*Primary Examiner*—Douglas W Owens
*Assistant Examiner*—Minh D A
(74) *Attorney, Agent, or Firm*—SNR Denton US LLP

(57) ABSTRACT

A light-emitting diode illumination circuit includes light-emitting diodes connected in series and compensating elements connected in parallel with the light-emitting diodes. Each of the compensating elements includes positive and negative terminals and at least one conductor having a predetermined melting point. The conductor melts in the event of open-circuit failure so that the terminals are connected.

12 Claims, 18 Drawing Sheets

BEFORE MELTING

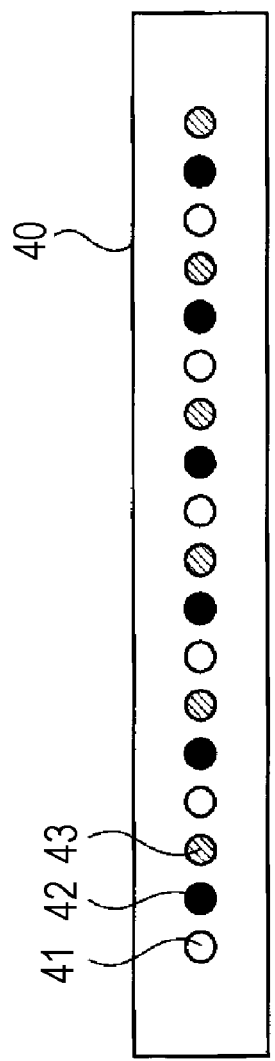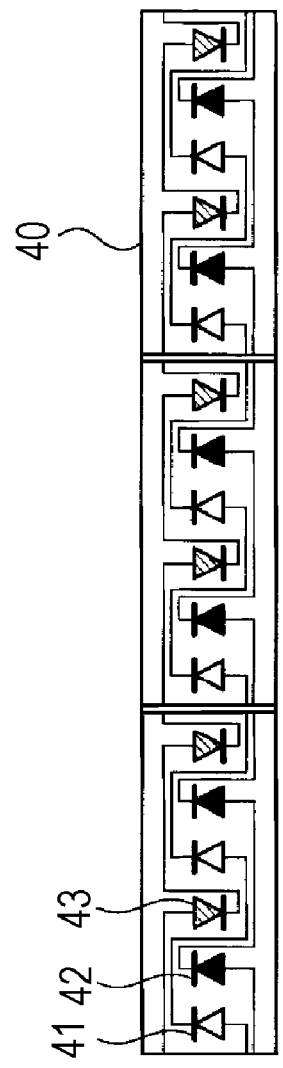

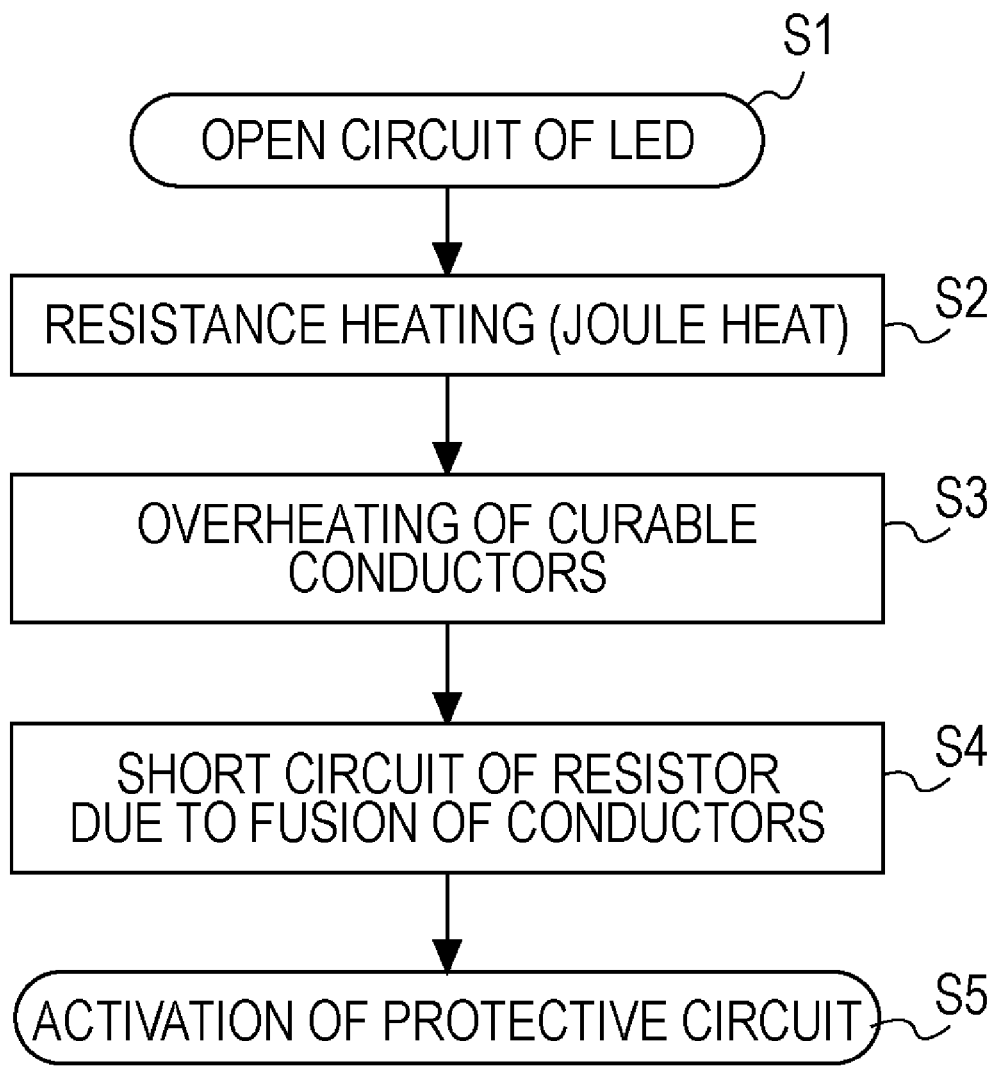

LIGHT-EMITTING DIODE ILLUMINATION CIRCUIT, ILLUMINATION DEVICE, AND LIQUID CRYSTAL DISPLAY APPARATUS

CROSS REFERENCES TO RELATED APPLICATIONS

The present invention contains subject matter related to Japanese Patent Application JP 2006-158870 filed in the Japanese Patent Office on Jun. 7, 2006, the entire contents of which are incorporated herein by reference.

BACKGROUND OF THE INVENTION

1. Field of the Invention

The present invention relates to light-emitting diode (LED) illumination circuits, illumination devices, and liquid crystal display (LCD) apparatuses having a protection function for open-circuit failure.

2. Description of the Related Art

LEDs are now replacing cold cathode fluorescent lamps (CCFLs) for use in backlights of LCD apparatuses to achieve an extended color range, reduced power consumption, and reduced amounts of environmentally unfriendly substances. A long CCFL can be used for a backlight of a large-screen LCD apparatus, which uses a large illumination area (the area that the backlight can illuminate). The CCFL may be powered from both ends thereof. On the other hand, LEDs utilize light emission from, for example, a semiconductor chip about 1 mm square. If LEDs are used, the number of LEDs used is increased for larger illumination areas, and the LEDs are connected in series for power supply.

LEDs used for backlights of LCD apparatuses no longer illuminate in the event of failures, including the end of service life. The failures of LEDs are broadly divided into three modes: (1) open-circuit failure due to breaks, (2) short-circuit failure, and (3) decreased light intensity.

A variety of attempts have been made to prevent such failures. For example, Japanese Unexamined Patent Application Publication No. 2002-335012 discloses an LED based on a technique against open-circuit failure. This LED includes a light-emitting element and a semiconductor protective element connected in parallel therewith to electrically protect the light-emitting element. The light-emitting element includes a light-emitting layer formed of a nitride semiconductor containing at least gallium. The protective element becomes conductive either in a forward direction or in a reverse direction at an applied voltage above the forward voltage of the light-emitting element.

SUMMARY OF THE INVENTION

In the known art, the failures described above are detected using independent drive circuits for driving individual LEDs and a system for constant feedback of the operating conditions of the LEDs. However, such illumination circuits are impractical in terms of cost.

Each of LEDs used for a backlight of an LCD apparatus consumes high power, and the number of LEDs used therefor is relatively small. If some of the LEDs fail, the backlight causes unevenness and degraded image quality.

In addition, high-power matrix-driving large-scale integrated circuits (LSIs), for example, are not available for LED-driving systems for illumination applications; such LSIs are practically disadvantageous in terms of cost. Instead, the LEDs are connected in series for driving. The series-connected LEDs, however, can cause problems such as significant color unevenness because a break at any of the LEDs causes the entire LED array to fail. Although thyristors can be used to protect the LEDs, they undesirably increase circuit size (installation space) and cost.

Accordingly, it is desirable to provide a simple system that can prevent illumination failure of an entire array of series-connected LEDs in the event of open-circuit failure.

A light-emitting diode illumination circuit according to an embodiment of the present invention includes light-emitting diodes connected in series and compensating elements connected in parallel with the light-emitting diodes. Each of the compensating elements includes positive and negative terminals and at least one conductor having a predetermined melting point. The conductor melts in the event of open-circuit failure so that the terminals are connected.

If an open-circuit failure occurs at one of the series-connected light-emitting diodes, a potential difference applied to the failed light-emitting diode causes melting of the conductor of the corresponding compensating element to connect the terminals thereof, so that the compensating element is short-circuited. The light-emitting diode illumination circuit can therefore prevent illumination failure of the other light-emitting diodes.

A light-emitting diode illumination circuit according to another embodiment of the present invention includes light-emitting diodes connected in series and compensating elements connected in parallel with the light-emitting diodes. Each of the compensating elements includes a resistor, two terminals at both ends thereof, an insulator between the two terminals, and a conductive paste on the insulator between the two terminals. The insulator transfers heat from the resistor to the conductive paste in the event of open-circuit failure. The conductive paste electrically connects the two terminals after reaching a predetermined temperature.

If an open-circuit failure occurs at one of the series-connected light-emitting diodes, a potential difference applied to the failed light-emitting diode causes the corresponding compensating element to be short-circuited through the conductive paste between the terminals of the compensating element. The light-emitting diode illumination circuit can therefore prevent illumination failure of the other light-emitting diodes.

An illumination device according to another embodiment of the present invention includes a light-emitting diode illumination circuit including light-emitting diodes connected in series and compensating elements connected in parallel with the light-emitting diodes. Each of the compensating elements includes positive and negative terminals and at least one conductor having a predetermined melting point. The conductor melts in the event of open-circuit failure so that the terminals are connected.

If an open-circuit failure occurs at one of the series-connected light-emitting diodes, a potential difference applied to the failed light-emitting diode causes melting of the conductor of the corresponding compensating element to connect the terminals thereof, so that the compensating element is short-circuited. The light-emitting diode illumination circuit can therefore prevent illumination failure of the other light-emitting diodes.

An illumination device according to another embodiment of the present invention includes a light-emitting diode illumination circuit including light-emitting diodes connected in series and compensating elements connected in parallel with the light-emitting diodes. Each of the compensating elements includes a resistor, two terminals at both ends thereof, an insulator between the two terminals, and a conductive paste on the insulator between the two terminals. The insulator transfers heat from the resistor to the conductive paste in the event of open-circuit failure. The conductive paste electrically connects the two terminals after reaching a predetermined temperature.

If an open-circuit failure occurs at one of the series-connected light-emitting diodes, a potential difference applied to the failed light-emitting diode causes the corresponding compensating element to be short-circuited through the conductive paste between the terminals of the compensating element. The light-emitting diode illumination circuit can therefore prevent illumination failure of the other light-emitting diodes.

A liquid crystal display apparatus according to another embodiment of the present invention includes a backlight including a light-emitting diode illumination circuit including light-emitting diodes connected in series and compensating elements connected in parallel with the light-emitting diodes. Each of the compensating elements includes positive and negative terminals and at least one conductor having a predetermined melting point. The conductor melts in the event of open-circuit failure so that the terminals are connected.

If an open-circuit failure occurs at one of the series-connected light-emitting diodes, a potential difference applied to the failed light-emitting diode causes melting of the conductor of the corresponding compensating element to connect the terminals thereof, so that the compensating element is short-circuited. The light-emitting diode illumination circuit can therefore prevent illumination failure of the other light-emitting diodes.

A liquid crystal display apparatus according to another embodiment of the present invention includes a backlight including a light-emitting diode illumination circuit including light-emitting diodes connected in series and compensating elements connected in parallel with the light-emitting diodes. Each of the compensating elements includes a resistor, two terminals at both ends thereof, an insulator between the two terminals, and a conductive paste on the insulator between the two terminals. The insulator transfers heat from the resistor to the conductive paste in the event of open-circuit failure. The conductive paste electrically connects the two terminals after reaching a predetermined temperature.

If an open-circuit failure occurs at one of the series-connected light-emitting diodes, a potential difference applied to the failed light-emitting diode causes the corresponding compensating element to be short-circuited through the conductive paste between the terminals of the compensating element. The light-emitting diode illumination circuit can therefore prevent illumination failure of the other light-emitting diodes.

As described above, the light-emitting diode illumination circuits according to the embodiments of the present invention can prevent illumination failure of the entire array of series-connected light-emitting diodes with a simple structure, that is, using a low-melting-point conductor or a conductive paste. The light-emitting diode illumination circuits therefore have the advantage of maintaining stable illumination operation.

The illumination devices according to the embodiments of the present invention, which include the light-emitting diode illumination circuits described above, have the advantage of providing stable illumination when used for backlights of liquid crystal display apparatuses.

The liquid crystal display apparatuses according to the embodiments of the present invention, which include the backlights described above, have the advantage of providing stable illumination for stable image quality.

BRIEF DESCRIPTION OF THE DRAWINGS

FIG. 2 is a diagram showing an example of an arrangement of light-emitting diodes in a backlight according to the first embodiment;

FIG. 3 is a diagram showing an example of connection of the light-emitting diodes in the backlight according to the first embodiment;

FIG. 8 is a flowchart of the protection operation of the light-emitting diode illumination circuit according to the first embodiment;

DESCRIPTION OF THE PREFERRED EMBODIMENTS

Preferred embodiments of the present invention will now be described with reference to the accompanying drawings.

Figure 1:
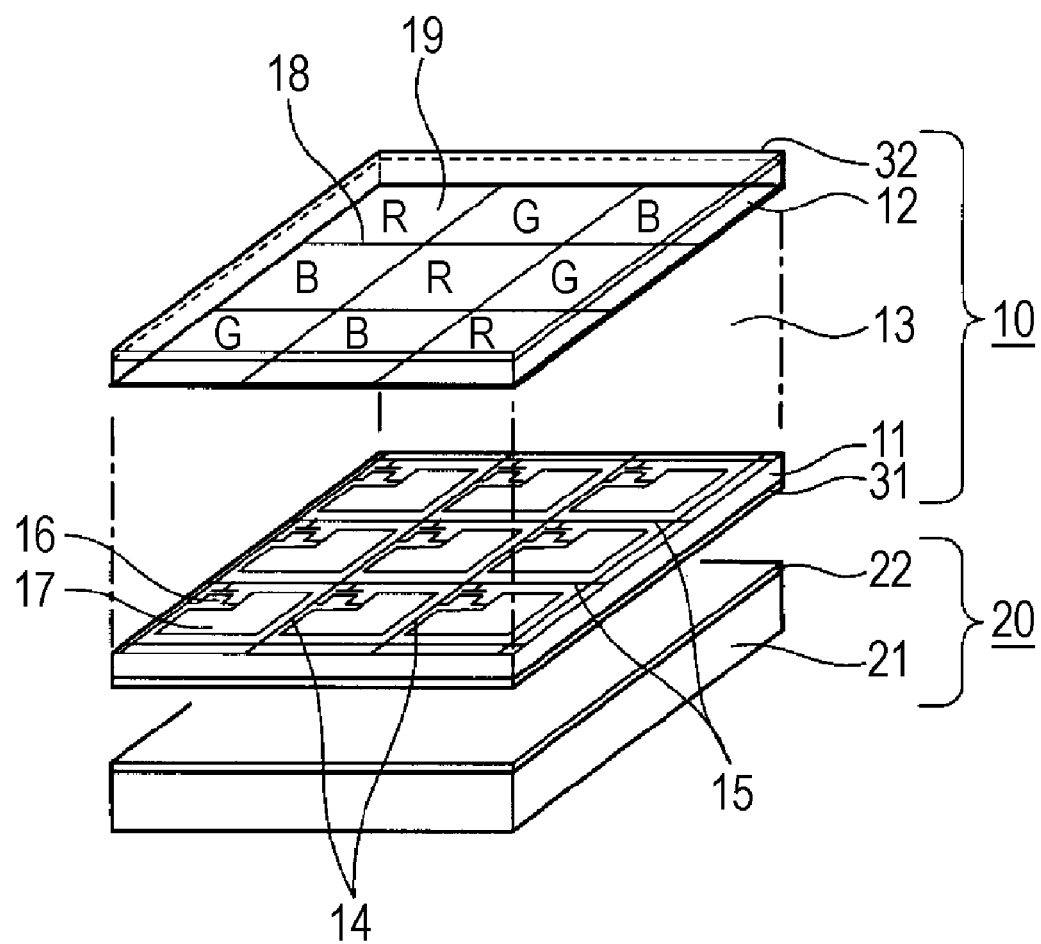
FIG. 1 is a schematic exploded view of a liquid crystal display apparatus according to a first embodiment of the present invention.

A first embodiment of the present invention will be described with reference to FIGS. 1 to 12. FIG. 1 is a schematic exploded view of a liquid crystal display (LCD) apparatus having an illumination device including a light-emitting diode (LED) illumination circuit according to this embodiment as a backlight.

The LCD apparatus according to this embodiment is, for example, a transmissive color LCD apparatus, as shown in FIG. 1. This LCD apparatus includes a transmissive color LCD panel 10 and a backlight 20 on the rear of the LCD panel 10. Although not shown in the drawings, the LCD apparatus may also include, for example, a receiver for receiving terrestrial and/or satellite television broadcasting (such as an analog or digital tuner), a video signal processor for processing video signals received by the receiver, an audio signal processor for processing audio signals received by the receiver, and an audio signal output unit (such as a speaker) for outputting the audio signals processed by the audio signal processor.

The LCD panel 10 includes two opposing transparent substrates, namely, a thin-film transistor (TFT) substrate 11 and a counter electrode substrate 12, which are formed of, for example, glass. A liquid crystal layer 13 is sealed between the two substrates 11 and 12. The liquid crystal layer 13 is formed of, for example, a twisted nematic (TN) liquid crystal. The TFT substrate 11 has signal lines 14, scanning lines 15, TFTs 16 at the intersections thereof, and pixel electrodes 17. The signal lines 14 and the scanning lines 15 are arranged in a matrix. The TFTs 16, which serve as switching elements, are sequentially selected via the scanning lines 15 to input video signals fed from the signal lines 14 to the corresponding pixel electrodes 17. A counter electrode 18 and a color filter 9 are disposed on an inner surface of the counter electrode substrate 12.

The LCD panel 10 is held between two polarizers 31 and 32. The LCD apparatus operates by active-matrix driving with the rear side of the LCD panel 10 illuminated with white light from the backlight 20 to display a desired full-color image.

In FIG. 1, the backlight 20 includes a light diffuser 22 disposed opposite the rear of the LCD panel 10 and a light source 21 including light-emitting elements (LEDs). The light diffuser 22 internally diffuses light exiting a backlight casing to provide uniform light intensity in surface emission. In addition, optically functional sheets, such as a diffusing sheet, a prism sheet, and a polarization conversion sheet, may be laminated on the light diffuser 22 to achieve enhanced image quality.

An arrangement of LEDs in the light source 21 of the backlight 20 will be described with reference to FIG. 2. FIG. 2 shows an arrangement of LEDs on a light source substrate 40, including six red (R) LEDs 41, six green (G) LEDs 42, and six blue (B) LEDs 43, that is, 18 LEDs in total. This arrangement is merely an example; various arrangements and combinations can be employed for a better balance in color mixing according to, for example, the ratings and luminous efficiency of the LEDs used.

FIG. 3 shows an example of connection of the LEDs 41 to 43 shown in FIG. 2. In this example, the LEDs 41 to 43 are connected in series for each color.

Figure 4:
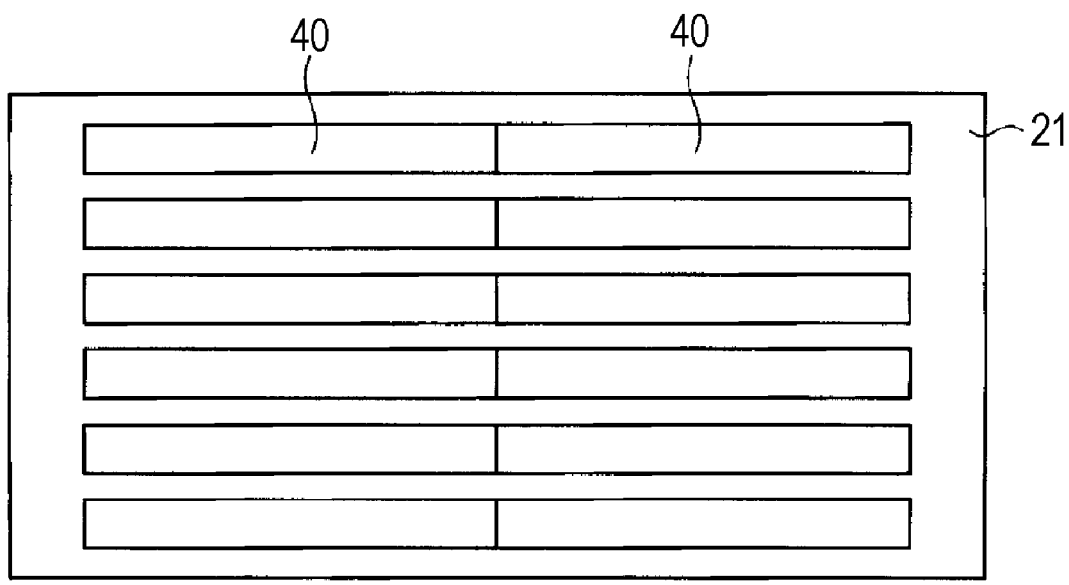
FIG. 4 is a diagram showing an example of an arrangement of light source substrates in the backlight according to the first embodiment.

A practical example of arrangement of the LEDs 41 to 43 in the light source 21 of the backlight 20 will be described with reference to FIG. 4. In the example of FIG. 4, the light source 21 includes 12 light source substrates 40 (LED arrays) arranged in two columns and six rows.

Figure 5:
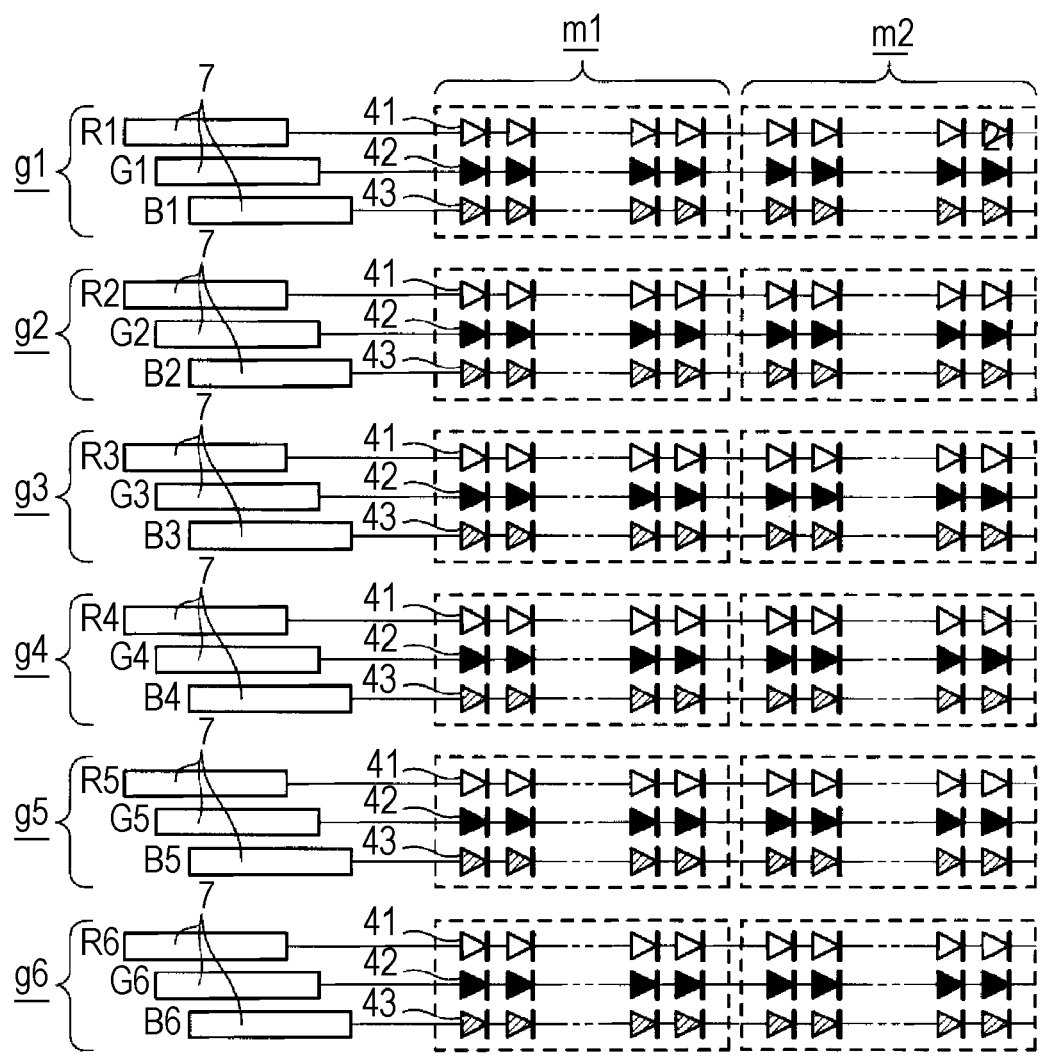
FIG. 5 is a diagram showing an example of a drive circuit of the backlight according to the first embodiment.

The backlight 20 uses a drive circuit configuration shown in FIG. 5 for the arrangement of the light source substrates 40 shown in FIG. 4. In FIG. 5, DC-DC converters 7 for voltage conversion of DC power are connected to series-connected LEDs m1 and m2 to supply the LEDs m1 and m2 with constant current. Six LED groups g1 to g6, each including the red LEDs 41, the green LEDs 42, and the blue LEDs 43, correspond to the six rows of the light source substrates 40. In each of the LED groups g1 to g6, the DC-DC converters 7 are assigned to the LEDs m1 and m2 for each color. In a line R1 of the first row (g1), for example, the DC-DC converter 7 for the red LEDs 41 supplies constant current to the series-connected LEDs m1 and m2. Lines G1 and B1 of the first row (g1) and lines R1, G1, and B1 of the second and subsequent rows (g2 to g6) are similar to the line R1 of the first row (g1) and will not be described herein.

Figure 6:
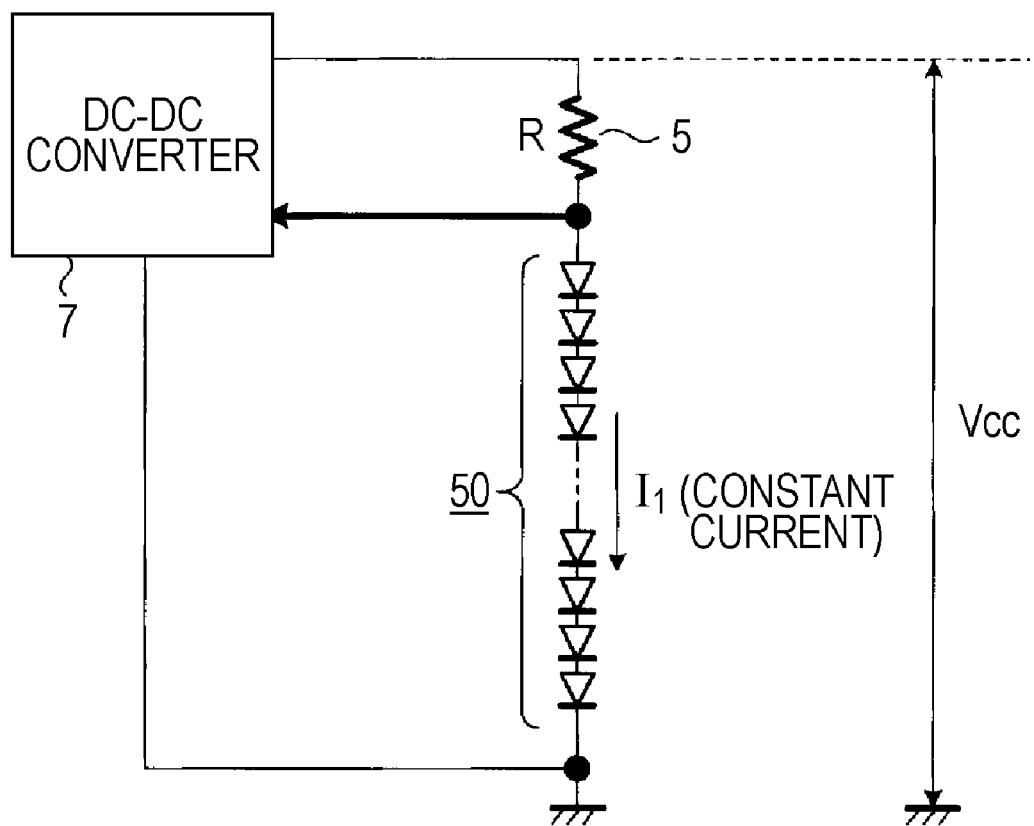
FIG. 6 is a diagram showing an example of a series circuit of the light-emitting diodes in the backlight according to the first embodiment.

An example of a circuit for supplying constant current to series-connected LEDs will be described. FIG. 6 shows an example of a series circuit of LEDs. In FIG. 6, the anode side of a series-connected LED array 50 is connected to a terminal of the DC-DC converter 7 via a resistor (R) 5, and the cathode side is connected to a ground terminal and another terminal of the DC-DC converter 7. The DC-DC converter 7 detects a voltage drop due to the resistor 5 with respect to output voltage $V_{cc}$, thus forming a feedback loop for supplying a predetermined current $I_1$ to the LED array 50. The LED array 50 shown in FIG. 6 corresponds to each of the lines R1, G1, and B1 (m1 and m2) of the six LED groups g1 to g6. In this example, accordingly, the backlight 20 includes six rows (g1 to g6) by three lines (R, G, and B) of circuits as shown in FIG. 6.

For example, a backlight for use in a typical 40-inch LCD apparatus includes about 350 LEDs that are connected in series for each color and are separately powered for illumination.

Figure 7A:
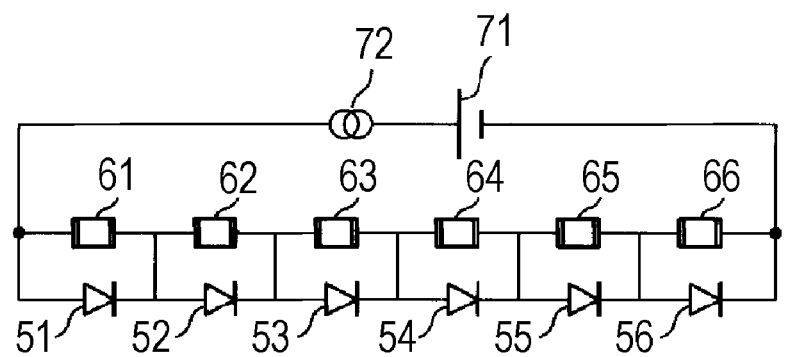
FIGS. 7A, 7B, and 7C are diagrams showing a light-emitting diode illumination circuit according to the first embodiment.
Figure 7B:
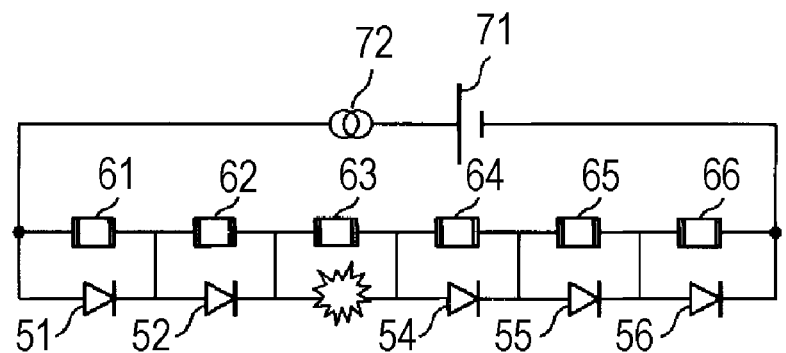
Figure 7C:
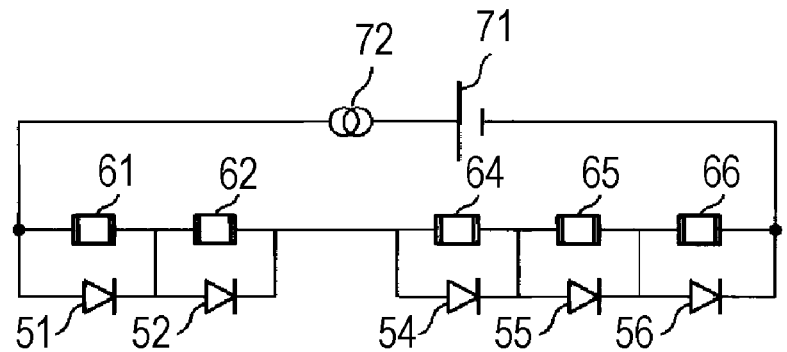

The protection operation of the LED illumination circuit according to this embodiment will be described. FIGS. 7A, 7B, and 7C are circuit diagrams of the LED illumination circuit according to this embodiment, showing normal, open-circuit, and short-circuit conditions, respectively. The operation of the LED illumination circuit shown in FIGS. 7A, 7B, and 7C will be described with reference to the flowchart of FIG. 8. If an open-circuit failure occurs at any of the series-connected LEDs of the LED illumination circuit, a potential difference applied to the failed LED causes the corresponding protective element to be short-circuited, thereby avoiding illumination failure of the other LEDs.

In FIG. 7A, a protective circuit is configured by connecting compensating elements (protective elements) 61 to 66 in parallel with series-connected LEDs 51 to 56. A power supply 71 and a constant current source 72 are connected in series with the protective circuit to form the LED illumination circuit according to this embodiment. A negative electrode of the power supply 71 is connected to the cathode side of the series-connected LEDs 51 to 56, and a terminal of the constant current source 72 is connected to the anode side of the series-connected LEDs 51 to 56. The number of series-connected LEDs shown is merely an example. The power supply 71 and the constant current source 72 are merely an example of a power circuit used for the backlight 20; naturally, the power circuit used is not limited to this example.

Figure 9:
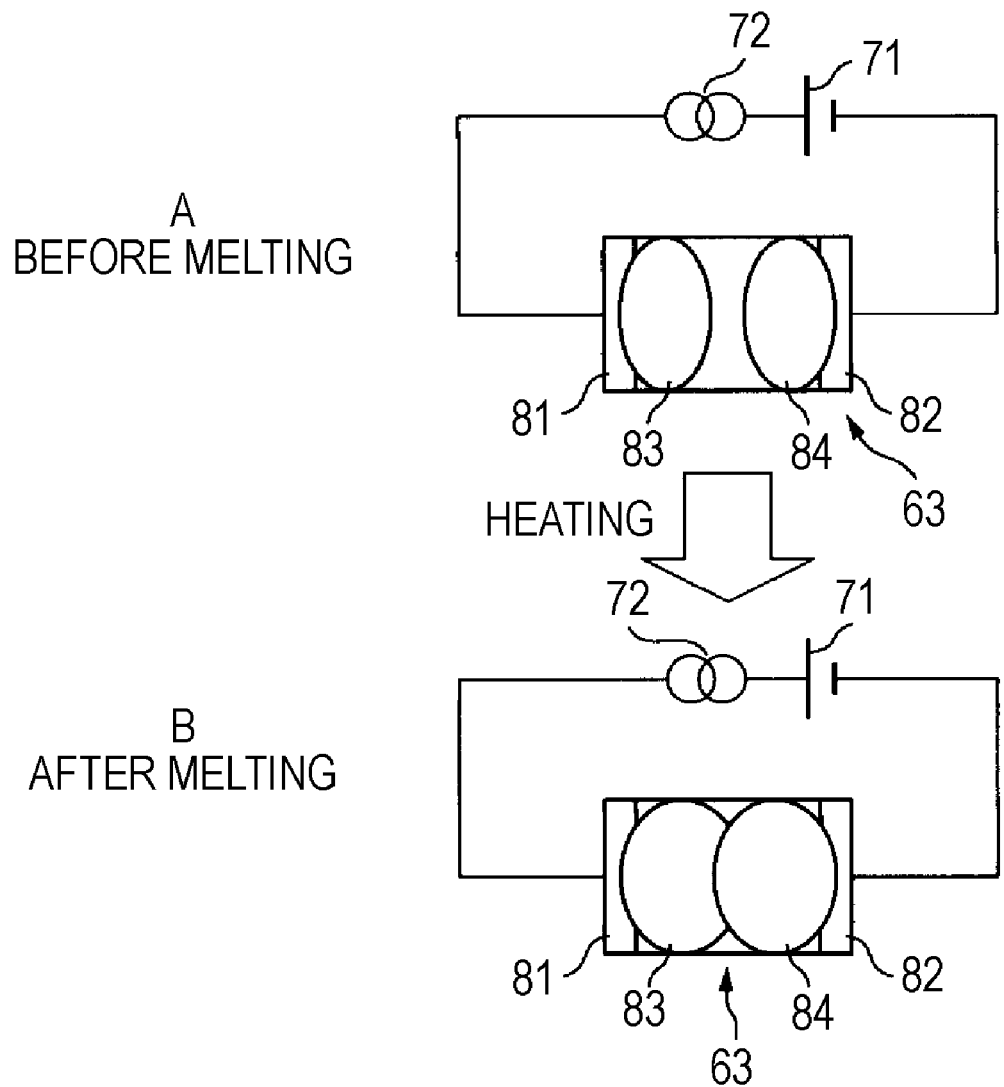
FIG. 9 is a diagram showing a compensating element according to the first embodiment.
Figure 10:
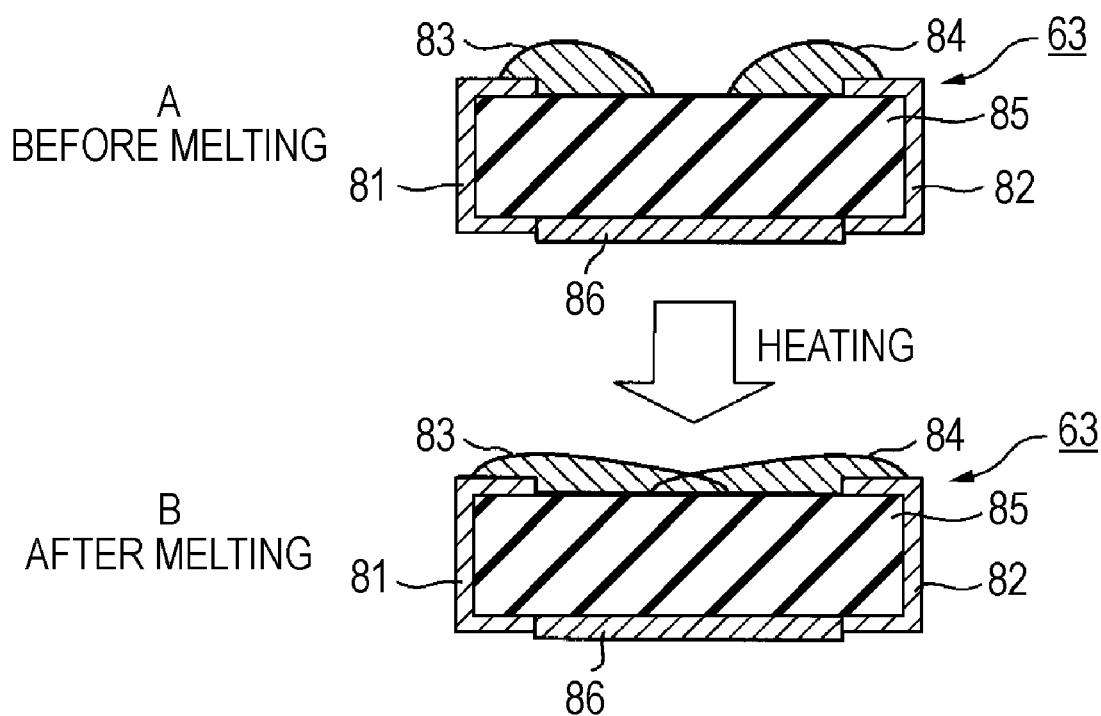
FIG. 10 is a schematic sectional view of a compensating element according to the first embodiment.

The compensating elements 61 to 66 used in this embodiment will be described with reference to FIGS. 9 and 10. FIG. 9 is a schematic diagram of one of the compensating elements 61 to 66, namely, the compensating element 63. FIG. 10 is a schematic sectional view of the compensating element 63 shown in FIG. 9. In FIGS. 9 and 10, the compensating element 63 includes an insulator 85, a resistor 86 formed on the insulator 85 by coating or printing, terminals 81 and 82 disposed on both sides of the insulator 85 and connected to positive and negative electrodes, respectively, of the resistor 86, and low-melting-point conductors (curable conductors) 83 and 84 disposed at or around the connections of the insulator 85 and the two terminals 81 and 82. The low-melting-point conductors 83 and 84, typically solder, melts after reaching a predetermined temperature. The insulator 85 transfers heat generated by the resistor 86 to the conductors 83 and 84, which melt after reaching the predetermined temperature. The insulator 85 is preferably formed of an insulating material with high thermal conductivity and heat resistance, for example, ceramic.

The conductors 83 and 84 may be formed of a material having a lower melting point than a solder used for fixing (connecting) the compensating element 63 to an LED illumination circuit board. If, for example, the solder has a melting point of about 200° C. to 300° C., or higher, the conductors 83 and 84 may be formed of a material having a lower melting point than the solder, for example, about 120° C. to 130° C. The compensating element 63 may also be connected to the circuit board by holding it between, for example, metal electrodes attached to the board, or by attaching a casing (box) so as to surround the resistor 86.

Under the normal conditions, as shown in FIG. 7A, the compensating element 63 is not conductive because the low-melting-point conductors 83 and 84 are separated from each other (see parts A of FIGS. 9 and 10).

That is, the resistance between the terminals 81 and 82 of the compensating element 63 is larger than that of the LED 53, for example, 100 times or higher that of the LED 53, under the initial conditions (see FIG. 7A). In normal operation, therefore, the compensating element 63 allows little current to flow therethrough and thus consumes little power. For example, the compensating element 63 consumes a power of only 0.0125 W (500 Ω×5 mA×5 mA) under the conditions that the resistance of the compensating element 63 is 100 times that of the LED 53, the LED 53 has a resistance of 5Ω, and the current is 500 mA. Thus, the compensating element 63 does not significantly generate heat or increase power consumption. The compensating element 63 has been described merely as an example, and the other compensating elements 61, 62, and 64 to 66 are similar to the compensating element 63.

If the LED 53 is accidentally open-circuited (Step S1; see FIG. 7B), the low current driving the LED 53 under the normal conditions, for example, a current of 500 mA, flows through the compensating element 63, which then generates joule heat (Step S2). The insulator 85 transfers the heat to the low-melting-point conductors 83 and 84. If the temperature of the compensating element 63 exceeds the melting point of the low-melting-point conductors 83 and 84 (Step S3), the low-melting-point conductors 83 and 84 melt and fuse together to connect the terminals 81 and 82 (see parts B of FIGS. 9 and 10), so that the compensating element 63 is short-circuited (Step S4). The protective circuit is then activated (Step S5), and the compensating element 63 no longer generates heat because the current flows through the connection (fused conductors 83 and 84). The failed LED 53 is thus bypassed to close the LED illumination circuit (see FIG. 7C). Although the failed LED 53 does not illuminate, the other series-connected LEDs 51, 52, and 54 to 56 can illuminate normally and can be used for backlighting.

According to the first embodiment, as described above, series-connected LEDs can be driven at constant current without causing illumination failure in the event of an open circuit at any of the LEDs because a potential difference applied to the failed LED causes melting of low-melting-point conductors provided on a compensating element to short-circuit the compensating element.

In addition, the LEDs can be mounted on a heat-dissipating substrate (light source substrate) to avoid the problem of temperature rise of the LEDs.

An LED illumination circuit according to this embodiment thus has a simple structure including LED chips having compensating elements that are short-circuited by fusion of conductors. This LED illumination circuit can prevent illumination failure of the entire array of series-connected LEDs to maintain stable illumination operation. This enhances the reliability of the LED illumination circuit.

The LED illumination circuit can be applied to an illumination device for use as a backlight of an LCD apparatus. The LED illumination circuit can stabilize the illumination operation of the backlight and thus stabilize the image quality of the LCD apparatus.

Figure 11:
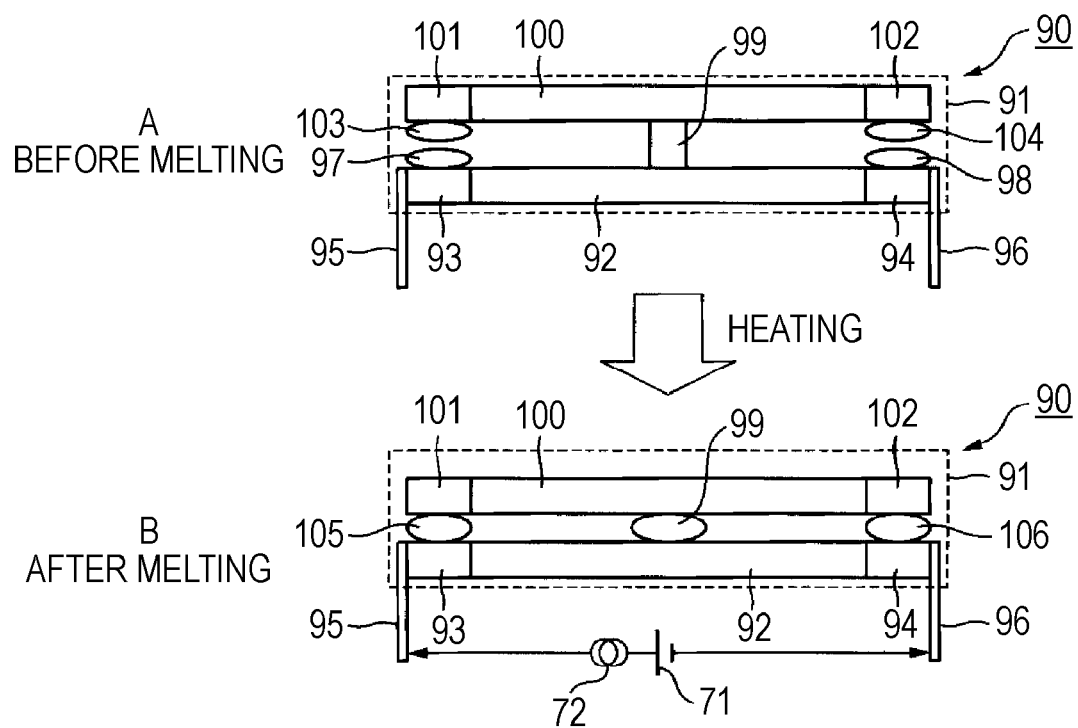
FIG. 11 is a diagram showing a compensating element according to a second embodiment of the present invention.

A compensating element according to a second embodiment of the present invention will be described. FIG. 11 is a diagram of the compensating element according to the second embodiment. In part A of FIG. 11, a compensating element 90 includes a resistor 92 for heating, a low-resistance conductor 100, and a casing (box) 91 accommodating the resistor 92 and the low-resistance conductor 100. The resistor 92 has terminals 93 and 94 at both ends thereof and conductors 97 and 98 on the terminals 93 and 94, respectively. The terminals 93 and 94 are connected to leads 95 and 96, respectively, fixed to a light source substrate. The low-resistance conductor 100 has terminals 101 and 102 at both ends thereof and conductors 103 and 104 on the terminals 101 and 102, respectively. The low-resistance conductor 100 is supported by a conductive support 99 with a predetermined distance between the low-resistance conductor 100 and the resistor 92. The support 99 transfers heat from the resistor 92 to the conductors 103 and 104 of the low-resistance conductor 100. The low-resistance conductor 100 is composed of a resistor chip having a resistance of 0Ω or a conductive plate. The conductors 97, 98, 103, and 104 and the support 99 may be formed of the same conductive material as used in the first embodiment.

If an LED having the compensating element 90 causes open-circuit failure, current flows through the resistor 92 to generate heat, and the support 99 melts after reaching a predetermined temperature. The conductors 97 and 98 of the resistor 92 then melt and fuse with the respective conductors 103 and 104 of the low-resistance conductor 100 to electrically connect the terminals 93 and 94 of the resistor 92 to the respective terminals 101 and 102 of the low-resistance conductor 100 via conductors 105 and 106 (see part B of FIG. 11). As a result, current flows through the low-resistance conductor 100 between the terminals 101 and 102, so that the compensating element 90 is short-circuited.

According to this embodiment, as described above, the low-resistance conductor 100 is disposed above the resistor 92, and the terminal 93 is connected to the terminal 101 with the conductor 105 while the terminal 94 is connected to the terminal 102 with the conductor 106. The compensating element 90 thus allows more reliable connection than the compensating element 63 shown in FIGS. 9 and 10. The other advantages of the second embodiment are the same as those of the first embodiment.

Figure 12:
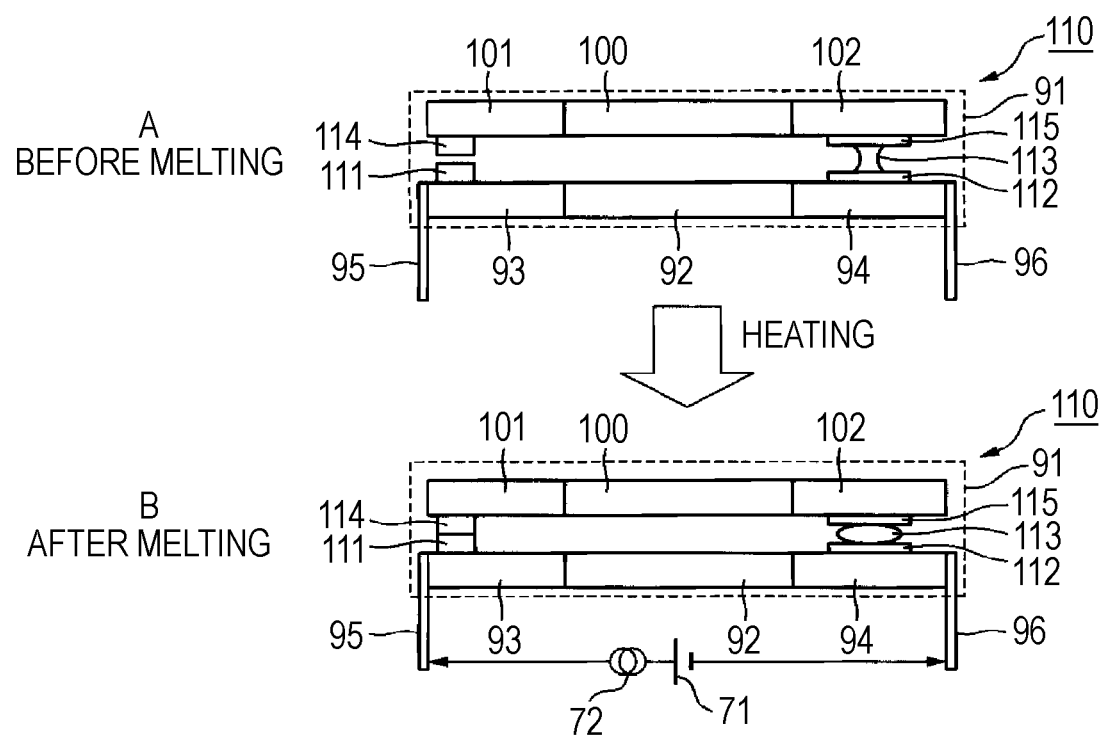
FIG. 12 is a diagram showing a compensating element according to a third embodiment of the present invention.

A compensating element according to a third embodiment of the present invention will be described. FIG. 12 is a diagram of the compensating element according to the third embodiment. In comparison with the compensating element 90 shown in FIG. 11, the compensating element according to this embodiment is configured so that a terminal of a resistor can be brought into direct contact with a terminal of a low-resistance conductor.

In part A of FIG. 12, a compensating element 110 includes a resistor 92 and a low-resistance conductor 100. The resistor 92 has wide terminals 93 and 94 at both ends thereof, a first auxiliary terminal 111 on the terminal 93, and a second auxiliary terminal 112 on the terminal 94. The low-resistance conductor 100 has terminals 101 and 102 at both ends thereof, a third auxiliary terminal 114 on the terminal 101, and a fourth auxiliary terminal 115 on the terminal 102. Under normal conditions, the fourth auxiliary terminal 115 of the low-resistance conductor 100 is supported by a conductive support 113 disposed on the second auxiliary terminal 112 of the resistor 92. The first auxiliary terminal 111 of the resistor 92 is separated from the third auxiliary terminal 114 of the low-resistance conductor 100 by a predetermined distance.

If an LED having the compensating element 110 causes open-circuit failure, current flows through the resistor 92 to generate heat, and the support 113 melts after reaching a predetermined temperature. The first auxiliary terminal 111 of the resistor 92 then comes into direct contact with the third auxiliary terminal 114 of the low-resistance conductor 100. The second auxiliary terminal 112 of the resistor 92 is connected to the fourth auxiliary terminal 115 of the low-resistance conductor 100 via the melted support 113 (see part B of FIG. 12). Thus, the terminal 93 is electrically connected to the terminal 101 via the auxiliary terminals 111 and 114 while the terminal 94 is electrically connected to the terminal 102 via the auxiliary terminals 112 and 115. As a result, current flows through the low-resistance conductor 100 between the terminals 101 and 102, so that the compensating element 110 is short-circuited.

According to this embodiment, as described above, the low-resistance conductor 100 is disposed above the resistor 92, and the first auxiliary terminal 111 is brought into direct contact with the third auxiliary terminal 114 with the second auxiliary terminal 112 connected to the fourth auxiliary terminal 115 via the melted support 113. The compensating element 110 thus allows more reliable connection than the compensating element 90 shown in FIG. 11. The other advantages of the third embodiment are the same as those of the first embodiment.

Figure 13:
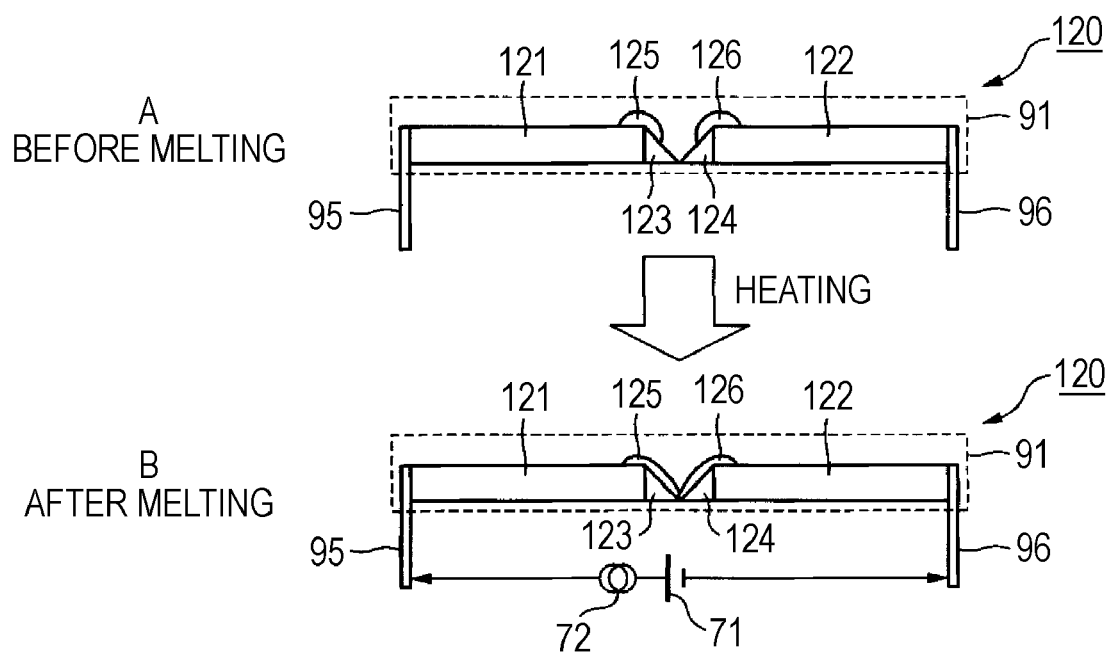
FIG. 13 is a diagram showing a compensating element according to a fourth embodiment of the present invention.

A compensating element according to a fourth embodiment of the present invention will be described. FIG. 13 is a diagram of the compensating element according to the fourth embodiment. In this embodiment, conductors are positioned so as to ensure connection between terminals via the conductors.

In part A of FIG. 13, a compensating element 120 includes a first resistor 123 having an inclined surface at an end thereof and a first terminal 121 at the other end thereof and a second resistor 124 having an inclined surface at an end thereof and a second terminal 122 at the other end thereof. The inclined surfaces of the resistors 123 and 124 face each other. Conductors 125 and 126 are disposed on top portions of the inclined surfaces of the resistor 123 and 124, respectively.

If an LED having the compensating element 120 causes open-circuit failure, current flows between the terminals 121 and 122 through the resistors 123 and 124 to generate heat, and the conductors 125 and 126 melt after reaching a predetermined temperature. The melted conductors 125 and 126 then flow down the inclined surfaces to connect the first terminal 121 of the first resistor 123 and the second terminal 122 of the second resistor 124 (see part B of FIG. 13). As a result, current flows between the terminals 121 and 122 through the conductors 125 and 126, so that the compensating element 120 is short-circuited. The compensating element 120 can be short-circuited if at least either of the conductors 125 and 126 electrically connects the terminals 123 and 124.

According to this embodiment, as described above, the resistors 123 and 124 have the inclined surfaces, which allow the melted conductors 125 and 126 to flow down and come into contact with the terminals 123 and 124. The compensating element 120 thus allows reliable connection between the terminals 121 and 122. The other advantages of the fourth embodiment are the same as those of the first embodiment.

Figure 14:
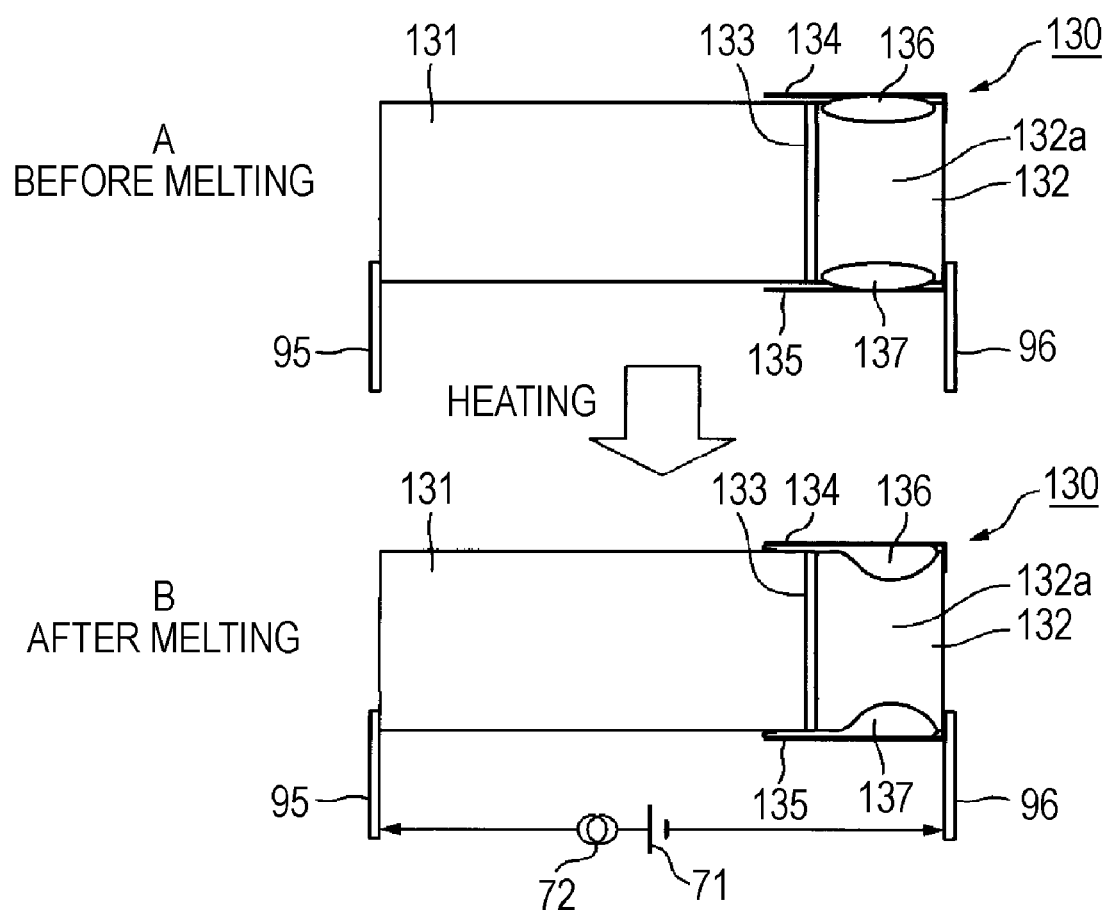
FIG. 14 is a diagram showing a compensating element according to a fifth embodiment of the present invention.

A compensating element according to a fifth embodiment of the present invention will be described. FIG. 14 is a top view of the compensating element according to the fifth embodiment. In this embodiment, capillarity is used to ensure connection between terminals.

In part A of FIG. 14, a compensating element 130 includes a resistor 133, terminals 131 and 132 disposed at both ends of the resistor 133, guides 134 and 135 disposed so as to partially cover the resistor 133 and the terminals 131 and 132 with a predetermined gap, and conductors 136 and 137 disposed on a top surface 132a of the terminal 132 near the guides 134 and 135, respectively.

If an LED having the compensating element 130 causes open-circuit failure, current flows between the terminals 131 and 132 through the resistor 133 to generate heat, and the conductors 136 and 137 on the terminal 132 melt after reaching a predetermined temperature. The melted conductors 136 and 137 then flow into the gaps between the terminal 132 and the guides 134 and 135. The conductors 136 and 137 are made to flow through the gaps by the action of capillarity to reach the terminal 131 across the resistor 133, thus connecting the terminals 131 and 132 (see part B of FIG. 14). As a result, current flows between the terminals 131 and 132 through the conductors 136 and 137, so that the compensating element 130 is short-circuited.

According to this embodiment, as described above, the compensating element 130 includes the resistor 133, the terminals 131 and 132, and the guides 134 and 135, which define predetermined gaps. The melted conductors 136 and 137 are made to flow from the terminal 132 to the terminal 131 through the gaps by the action of capillarity. The compensating element 130 thus allows reliable connection between the terminals 131 and 132. The other advantages of the fifth embodiment are the same as those of the first embodiment.

Figure 15:
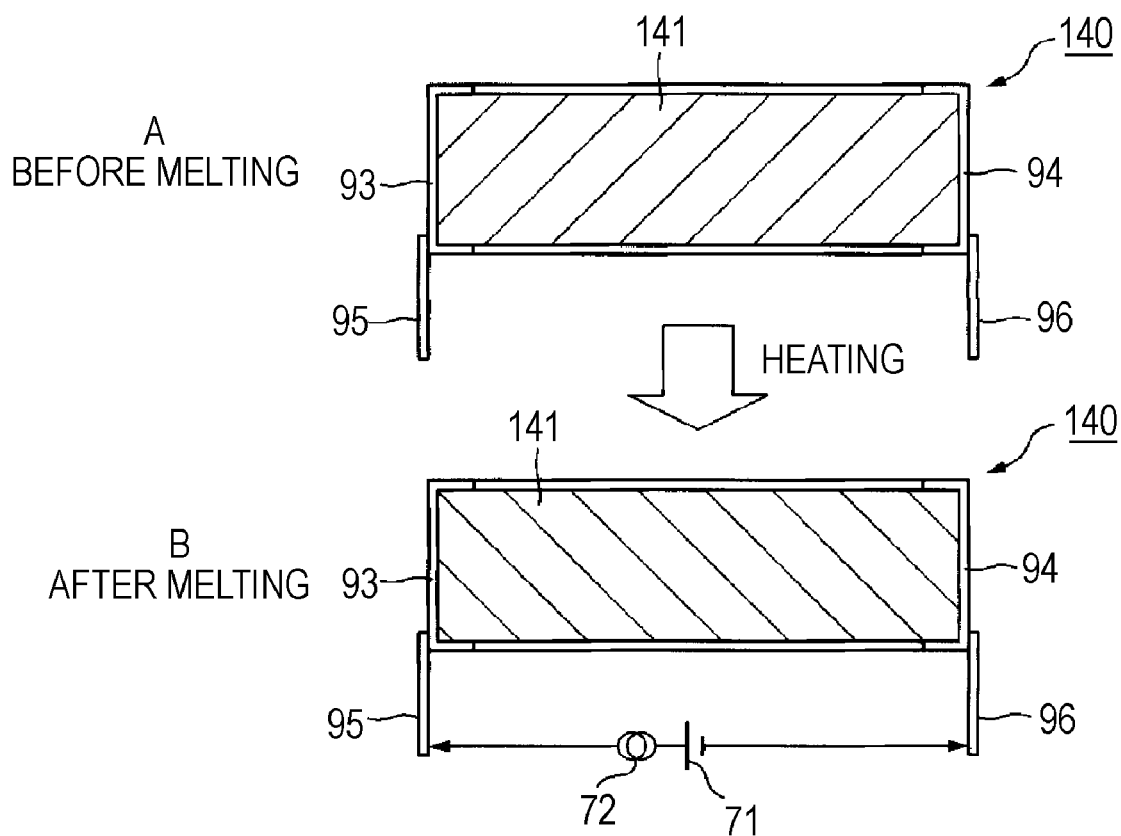
FIG. 15 is a diagram showing a compensating element according to a sixth embodiment of the present invention.

A compensating element according to a sixth embodiment of the present invention will be described. FIG. 15 is a top view of the compensating element according to the sixth embodiment. In this embodiment, terminals can be easily connected using a conductive paste.

In part A of FIG. 15, a compensating element 140 includes a resistor 86 (not shown), terminals 93 and 94 disposed at both ends of the resistor 86, an insulator 85 (not shown) disposed between the terminals 93 and 94, and a conductive paste 141 disposed on a surface of the insulator 85 between the terminals 93 and 94. The compensating element 140 according to this embodiment is similar to the compensating element 63 shown in FIGS. 9 and 10, although the conductive paste 141 is provided by coating or printing instead of the conductors 83 and 84. Under the normal conditions, no current flows through the conductive paste 141.

The conductive paste 141 used may be selected from various types of commercially available conductive pastes according to conditions such as operational temperature. For example, a conductive paste containing a conductive filler and a binder may be used. This conductive paste becomes conductive when the binder condenses at a predetermined temperature to bring filler particles into contact with each other.

If an LED having the compensating element 140 causes open-circuit failure, current flows between the terminals 93 and 94 through the resistor 86 to generate heat. The insulator 85 transfers the heat to the conductive paste 141, which becomes conductive after reaching a predetermined temperature (see part B of FIG. 15). As a result, current flows between the terminals 93 and 94 through the conductive paste 141, so that the compensating element 140 is short-circuited.

According to this embodiment, the conductive paste 141 can be used instead of a low-melting-point conductor to easily connect the terminals 93 and 94. The other advantages of the fifth embodiment are the same as those of the first embodiment.

Figure 16:
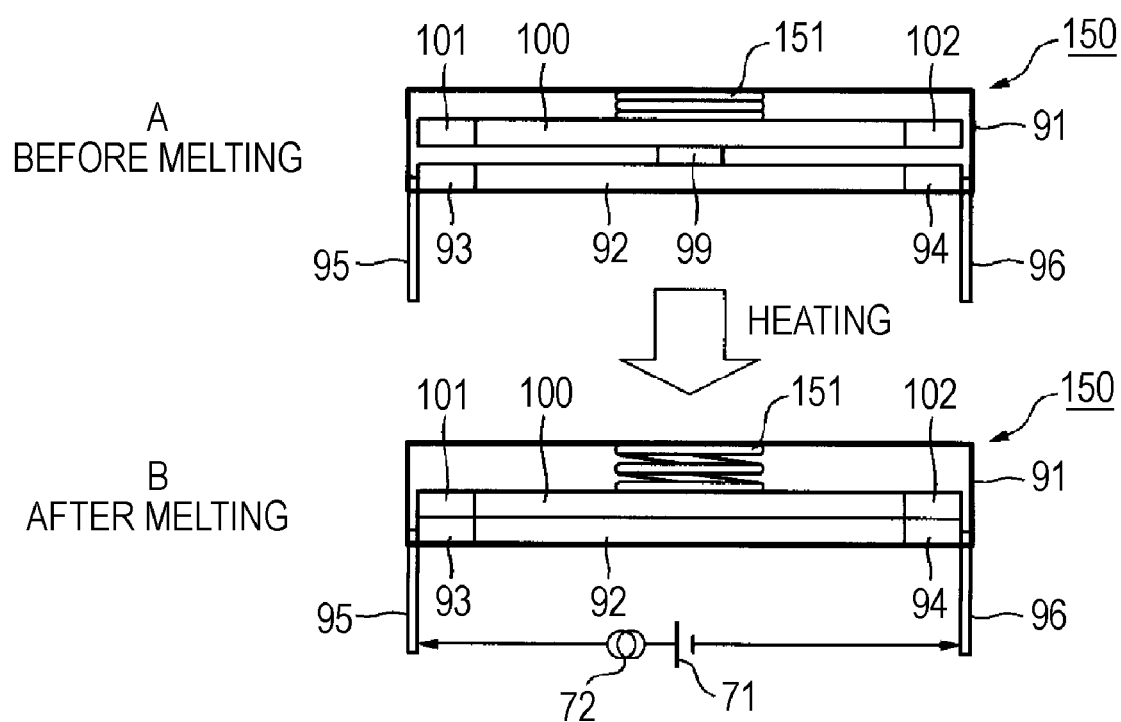
FIG. 16 is a diagram showing a compensating element according to a seventh embodiment of the present invention.

A compensating element according to a seventh embodiment of the present invention will be described. FIG. 16 is a diagram of the compensating element according to the seventh embodiment. In this embodiment, an elastic member is used to push a low-resistance conductor against a resistor so that terminals can be reliably connected.

In part A of FIG. 16, a compensating element 150 includes a resistor 92 having terminals 93 and 94 at both ends thereof, a low-resistance conductor 100 having terminals 101 and 102 at both ends thereof, an elastic member 151, and a casing 91. The low-resistance conductor 100 is supported by a support 99 disposed on the resistor 92. The support 99 is formed of a conductive material having a low melting point. The elastic member 151 is accommodated between the casing 91 and the low-resistance conductor 100. The elastic member 151 is compressed before melting. When the support 99 melts, the elastic member 151 pushes the low-resistance conductor 100 toward the resistor 92. In this embodiment, the elastic member 151 used is a compression coil spring.

If an LED having the compensating element 150 causes open-circuit failure, current flows between the terminals 93 and 94 through the resistor 92 to generate heat, and the support 99 melts after reaching a predetermined temperature. The compressed elastic member 151 then extends and pushes the low-resistance conductor 100 toward the resistor 92 by its elastic force to bring the conductor 100 into contact with the resistor 92 (see part B of FIG. 16). Thus, the terminals 93 and 94 of the resistor 92 are electrically connected to the respective terminals 101 and 102 of the low-resistance conductor 100. As a result, current flows between the terminals 101 and 102 through the low-resistance conductor 100, so that the compensating element 150 is short-circuited.

According to this embodiment, the terminals 101 and 102 can be reliably connected to the terminals 93 and 94, respectively, because the elastic force of the elastic member 151 pushes the low-resistance conductor 100 against the resistor 92. The other advantages of the fourth embodiment are the same as those of the first embodiment.

Figure 17:
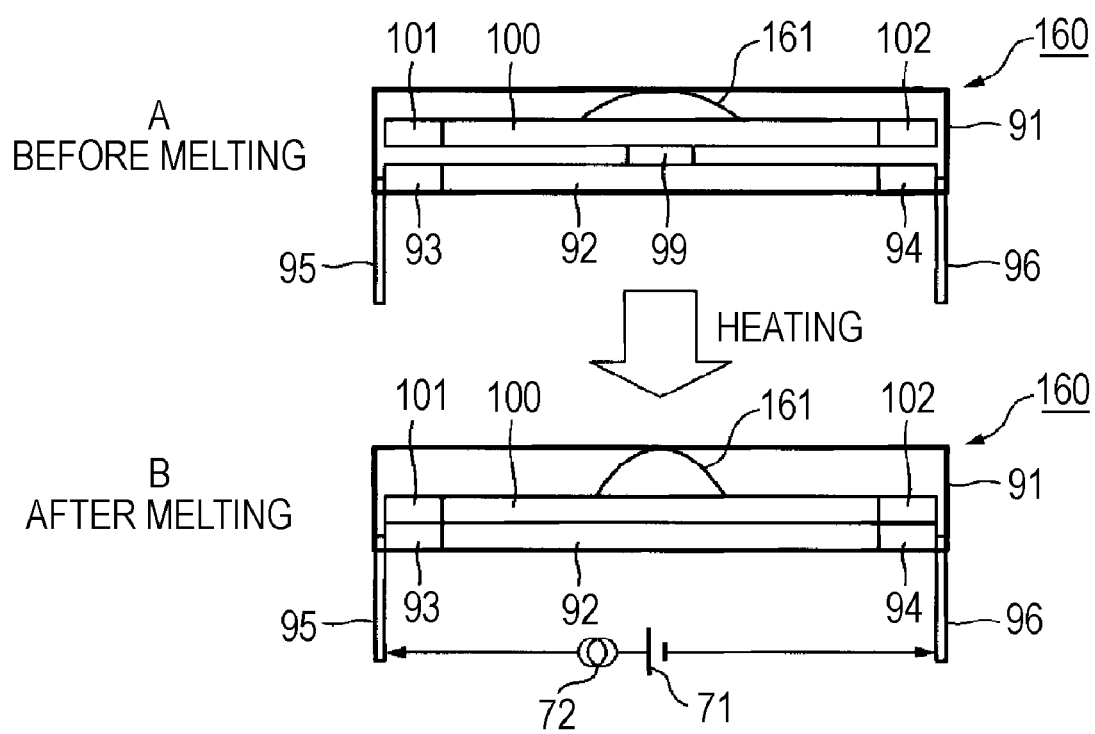
FIG. 17 is a diagram showing a compensating element according to an eighth embodiment of the present invention.

A compensating element according to an eighth embodiment of the present invention will be described. FIG. 17 is a diagram of the compensating element according to the eighth embodiment. In FIG. 17, a compensating element 160 according to this embodiment includes a disk spring 161 instead of the compression coil spring 151 shown in FIG. 16. The eighth embodiment provides the same advantages as the seventh embodiment. Other various elastic members that can be compressed before melting and extended after melting may be used, including leaf springs.

Figure 18:
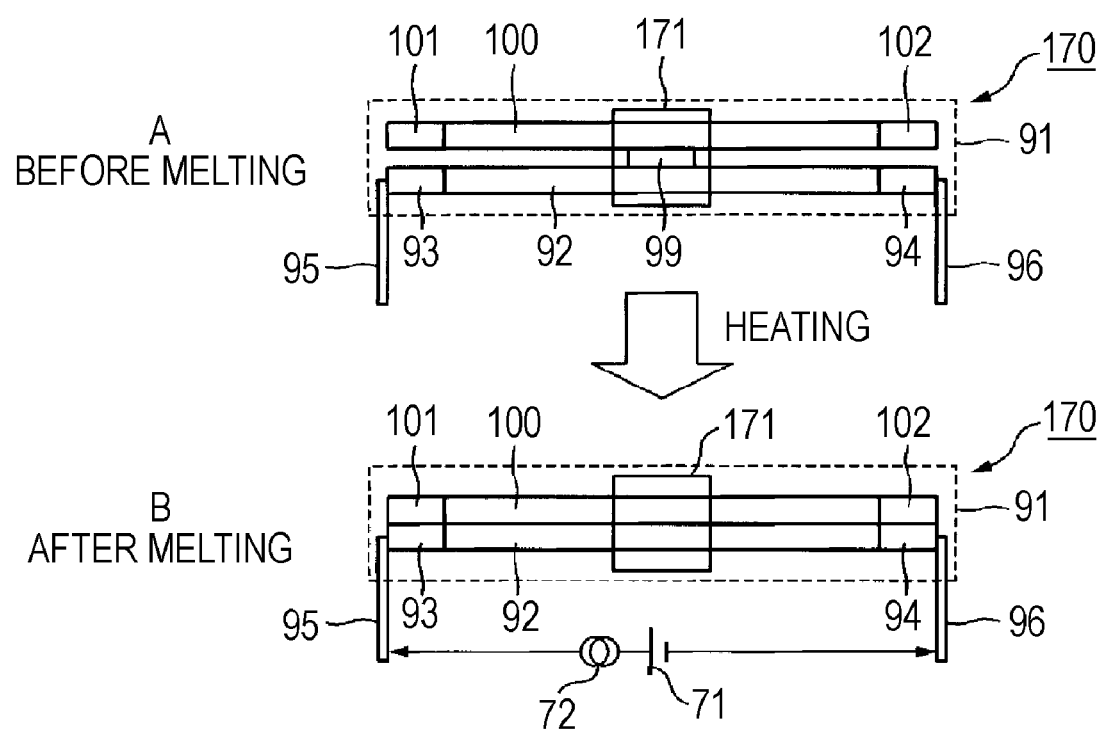
FIG. 18 is a diagram showing a compensating element according to a ninth embodiment of the present invention.

A compensating element according to a ninth embodiment of the present invention will be described. FIG. 18 is a diagram of the compensating element according to the ninth embodiment. In FIG. 18, a compensating element 170 according to this embodiment includes a clip spring 171 instead of the compression coil spring 151 shown in FIG. 16.

Figure 19A:
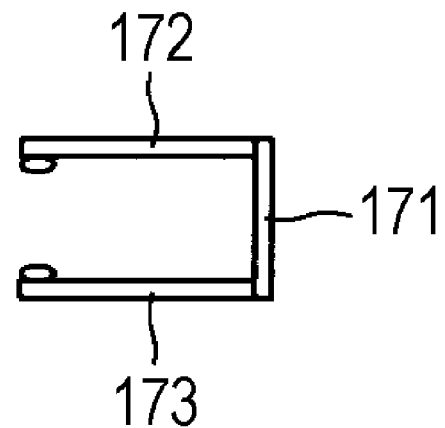
FIGS. 19A and 19B are diagrams showing a clip spring.
Figure 19B:
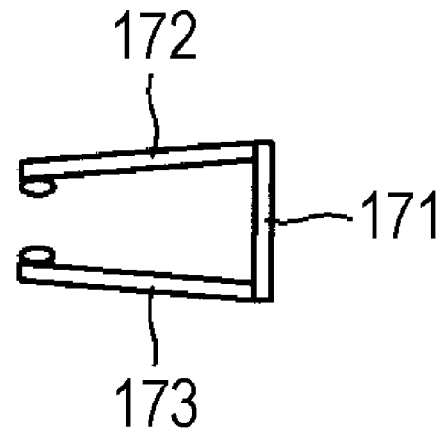

Part A of FIG. 19 shows the state of the clip spring 171 before melting of a support 99. Part B of FIG. 19 shows the state of the clip spring 171 after the melting of the support 99. The clip spring 171 is horseshoe-shaped in side view, having an upper contact portion 172 and a lower contact portion 173. The clip spring 171 holds a low-resistance conductor 100 and a resistor 92 with the contact portions 172 and 173 in contact with the top surface of the low-resistance conductor 100 and the bottom surface of the resistor 92, respectively. The clip spring 171 is opened before the melting of the support 99 and is closed after the melting of the support 99. The ninth embodiment provides the same advantages as the seventh embodiment.

In the embodiments described above, each protective element may be assigned to a plurality of series-connected LEDs, and not to a single LED. That is, each protective element may be connected in parallel with a plurality of LEDs within the range acceptable in terms of color mixing of the LEDs. This allows for a reduced number of protective elements used for an LED illumination circuit.

The illumination devices according to the embodiments described above, which are used as backlights for LCD apparatuses, are not limited to backlights and may also be used as, for example, display apparatuses.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting diode illumination circuit comprising:
light-emitting diodes connected in series; and
compensating elements connected in parallel with the light-emitting diodes, wherein,
each of the compensating elements includes (a) positive and negative terminals and (b) at least one conductor having a predetermined melting point, the conductor melting in the event of open-circuit failure so that the terminals are connected,
each of the compensating elements further includes (a) a resistor between the two terminals and (b) an insulator between the two terminals, and
the conductor is disposed at or near each of joints between the two terminals and the insulator, receives heat transferred from the resistor through the insulator, and melts after reaching a predetermined temperature.

2. A light-emitting diode illumination circuit comprising:
light-emitting diodes connected in series; and
compensating elements connected in parallel with the light-emitting diodes, wherein,
each of the compensating elements includes (a) positive and negative terminals and (b) at least one conductor having a predetermined melting point, the conductor melting in the event of open-circuit failure so that the terminals are connected,
each of the compensating elements further includes (a) a casing, (b) a resistor having terminals at both ends thereof, (c) a low-resistance conductor having terminals at both ends thereof, and (d) an elastic member configured to push the low-resistance conductor against the resistor,
the conductor is provided as a support so as to support the low-resistance conductor with respect to the resistor, and
if the support melts after reaching a predetermined temperature, elastic force of the elastic member brings the low-resistance conductor into contact with the resistor to electrically connect the terminals of the low-resistance conductor to the corresponding terminals of the resistor.

3. A light-emitting diode illumination circuit comprising:
light-emitting diodes connected in series; and
compensating elements connected in parallel with the light-emitting diodes, wherein,
each of the compensating elements includes (a) positive and negative terminals and (b) at least one conductor having a predetermined melting point, the conductor melting in the event of open-circuit failure so that the terminals are connected, each of the compensating elements further includes (a) a resistor having terminals at both ends thereof, a first auxiliary terminal on one of the terminals, and a second auxiliary terminal on the other terminal and (b) a low-resistance conductor having terminals at both ends thereof, a third auxiliary terminal on one of the terminals, and a fourth auxiliary terminal on the other terminal, the conductor is provided as a support between the second auxiliary terminal of the resistor and the fourth auxiliary terminal of the low-resistance conductor so as to maintain a predetermined distance between the first auxiliary terminal of the resistor and the third auxiliary terminal of the low-resistance conductor, and if the support melts after reaching a predetermined temperature, the third auxiliary terminal of the low-resistance conductor comes into contact with the first auxiliary terminal of the resistor and the fourth auxiliary terminal of the low-resistance conductor is connected to the second auxiliary terminal of the resistor through the melted support.

4. A light-emitting diode illumination circuit comprising: light-emitting diodes connected in series; and compensating elements connected in parallel with the light-emitting diodes, wherein, each of the compensating elements includes (a) positive and negative terminals and (b) at least one conductor having a predetermined melting point, the conductor melting in the event of open-circuit failure so that the terminals are connected, each of the compensating elements further includes (a) a resistor having terminals at both ends thereof, a first auxiliary terminal on one of the terminals, and a second auxiliary terminal on the other terminal and (b) a low-resistance conductor having terminals at both ends thereof, a third auxiliary terminal on one of the terminals, and a fourth auxiliary terminal on the other terminal, the conductor is provided as a support between the second auxiliary terminal of the resistor and the fourth auxiliary terminal of the low-resistance conductor so as to maintain a predetermined distance between the first auxiliary terminal of the resistor and the third auxiliary terminal of the low-resistance conductor, and if the support melts after reaching a predetermined temperature, the third auxiliary terminal of the low-resistance conductor comes into contact with the first auxiliary terminal of the resistor and the fourth auxiliary terminal of the low-resistance conductor is connected to the second auxiliary terminal of the resistor through the melted support.

5. A light-emitting diode illumination circuit comprising: light-emitting diodes connected in series; and compensating elements connected in parallel with the light-emitting diodes, wherein, each of the compensating elements includes (a) positive and negative terminals and (b) at least one conductor having a predetermined melting point, the conductor melting in the event of open-circuit failure so that the terminals are connected, each of the compensating elements further includes (a) a first resistor having an inclined surface at an end thereof and a first terminal at the other end thereof and (b) a second resistor having an inclined surface at an end thereof and a second terminal at the other end thereof, the inclined surfaces of the first and second resistors facing each other, the conductor is provided on a top portion of each of the inclined surfaces, and if the conductors provided on the inclined surfaces melt after reaching a predetermined temperature, the conductors flow down the inclined surfaces to connect the first terminal of the first resistor and the second terminal of the second resistor.

6. A light-emitting diode illumination circuit comprising: light-emitting diodes connected in series; and compensating elements connected in parallel with the light-emitting diodes, wherein, each of the compensating elements includes (a) positive and negative terminals and (b) at least one conductor having a predetermined melting point, the conductor melting in the event of open-circuit failure so that the terminals are connected, each of the compensating elements further includes (a) a resistor between the two terminals and (b) a guide disposed so as to partially cover the resistor and the terminals with a predetermined gap, the conductor is provided on one of the terminals near the guide, and if the conductor melts after reaching a predetermined temperature, the melted conductor is made to flow through the gap between one of the terminals and the guide by the action of capillarity to reach the other terminal, thereby connecting the two terminals.

7. The light-emitting diode illumination circuit according to claims 1-6, wherein the melting point of the conductor is lower than that of a solder used for fixing the compensating elements to a light-emitting diode illumination circuit board.

8. The light-emitting diode illumination circuit according to claim 7, wherein the elastic member is disposed between the casing and the low-resistance conductor and is compressed before the support melts.

9. The light-emitting diode illumination circuit according to claim 7, wherein the elastic member is a clip-like elastic member configured to hold the resistor and the low-resistance conductor together.

10. A light-emitting diode illumination circuit comprising: light-emitting diodes connected in series; and compensating elements connected in parallel with the light-emitting diodes, wherein each of the compensating elements includes
(a) a resistor,
(b) two terminals at both ends thereof,
(d) an insulator between the two terminals, and
(e) a conductive paste on the insulator between the two terminals, the insulator transferring heat from the resistor to the conductive paste in the event of open-circuit failure, the conductive paste electrically connecting the two terminals after reaching a predetermined temperature.

11. An illumination device comprising a light-emitting diode illumination circuit including:
light-emitting diodes connected in series; and
compensating elements connected in parallel with the light-emitting diodes,
wherein each of the compensating elements includes
(a) a resistor,
(b) two terminals at both ends thereof,
(c) an insulator between the two terminals, and
(d) a conductive paste on the insulator between the two terminals, the insulator transferring heat from the resistor to the conductive paste in the event of open-circuit failure, the conductive paste electrically connecting the two terminals after reaching a predetermined temperature.

12. A liquid crystal display apparatus comprising a backlight including a light-emitting diode illumination circuit including:

light-emitting diodes connected in series; and compensating elements connected in parallel with the light-emitting diodes, wherein each of the compensating elements includes (a) a resistor, two terminals at both ends thereof, (b) an insulator between the two terminals, and (c) a conductive paste on the insulator between the two terminals, the insulator transferring heat from the resistor to the conductive paste in the event of open-circuit failure, the conductive paste electrically connecting the two terminals after reaching a predetermined temperature.

* * * * *

UNITED STATES PATENT AND TRADEMARK OFFICE
CERTIFICATE OF CORRECTION

PATENT NO. : 7,884,553 B2
APPLICATION NO. : 11/749456
DATED : February 8, 2011
INVENTOR(S) : Haruaki Wada, Kunio Oshimo and Takenobu Urazono It is certified that error appears in the above-identified patent and that said Letters Patent is hereby corrected as shown below:

On the title page, item,

(30) Foreign Application Priority Data

"Jul. 6, 2006 (JP) 2006-158870"

should be

--June 7, 2006 (JP) 2006-158870--

Signed and Sealed this
Tenth Day of July, 2012

David J. Kappos
*Director of the United States Patent and Trademark Office*